(12) United States Patent
Varner et al.

(10) Patent No.: US 6,914,486 B2
(45) Date of Patent: Jul. 5, 2005

(54) SYSTEM AND METHOD FOR IMPROVED BIAS MATCHING

(75) Inventors: Alan Lee Varner, Tucson, AZ (US); Paul Damitio, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 85 days.

(21) Appl. No.: 10/619,878

(22) Filed: Jul. 15, 2003

(65) Prior Publication Data

US 2005/0012552 A1 Jan. 20, 2005

(51) Int. Cl.[7] ................................................. H03F 3/26
(52) U.S. Cl. ....................................... 330/267; 330/296
(58) Field of Search ............................ 330/9, 267, 285, 330/288, 296; 323/315, 316

(56) References Cited

U.S. PATENT DOCUMENTS

| 4,462,004 A | * | 7/1984 | Cox et al. ..................... 330/277 |
| 6,424,225 B1 | * | 7/2002 | Choi et al. ................... 330/289 |
| 6,765,443 B2 | * | 7/2004 | Pehike ......................... 330/296 |

* cited by examiner

Primary Examiner—Henry Choe
(74) Attorney, Agent, or Firm—W. Daniel Swayze, Jr.; W. James Brady; Frederick J. Telecky, Jr.

(57) ABSTRACT

Systems and methods to improve bias matching (e.g., for a current feedback amplifier) are described. A compensation signal is combined with one or more bias signals to mitigate mismatch between the bias signals. The compensation signal is generated to correspond to the mismatch between the bias signals. This approach can be implemented to improve performance of an associated amplifier, such as by reducing offset at an input of a portion of the amplifier (e.g., an input buffer) that is biased by the bias signals.

26 Claims, 5 Drawing Sheets

SYSTEM AND METHOD FOR IMPROVED BIAS MATCHING

TECHNICAL FIELD

The present invention relates to electrical circuits and, more particularly, to systems and method to provide improved bias matching, such as for an amplifier.

BACKGROUND OF INVENTION

Various types of amplifier circuits have been developed for a myriad of applications, such as including audio applications, video applications and communications applications to name a few. Some core considerations for most amplifier designs are the ability to support a wide bandwidth and provide low distortion in the amplified output signal.

A typical amplifier includes an input buffer that provides a buffered input signal to bias one or more subsequent stages according to the input signal. To implement the buffering, the input buffer receives biasing signals that establish a level at which the buffered signal is provided. Typically, the biasing signals are matched, or at least are intended to be matched.

One type of amplifier, namely a diode input current feedback amplifier, includes an input buffer having diodes that form part of the input buffer. This type of amplifier provides a straightforward design that generally provides a lower offset when compared to many existing alternative input buffer configurations. This input buffer configuration thus is useful in many high speed amplifier applications.

Figure 1:
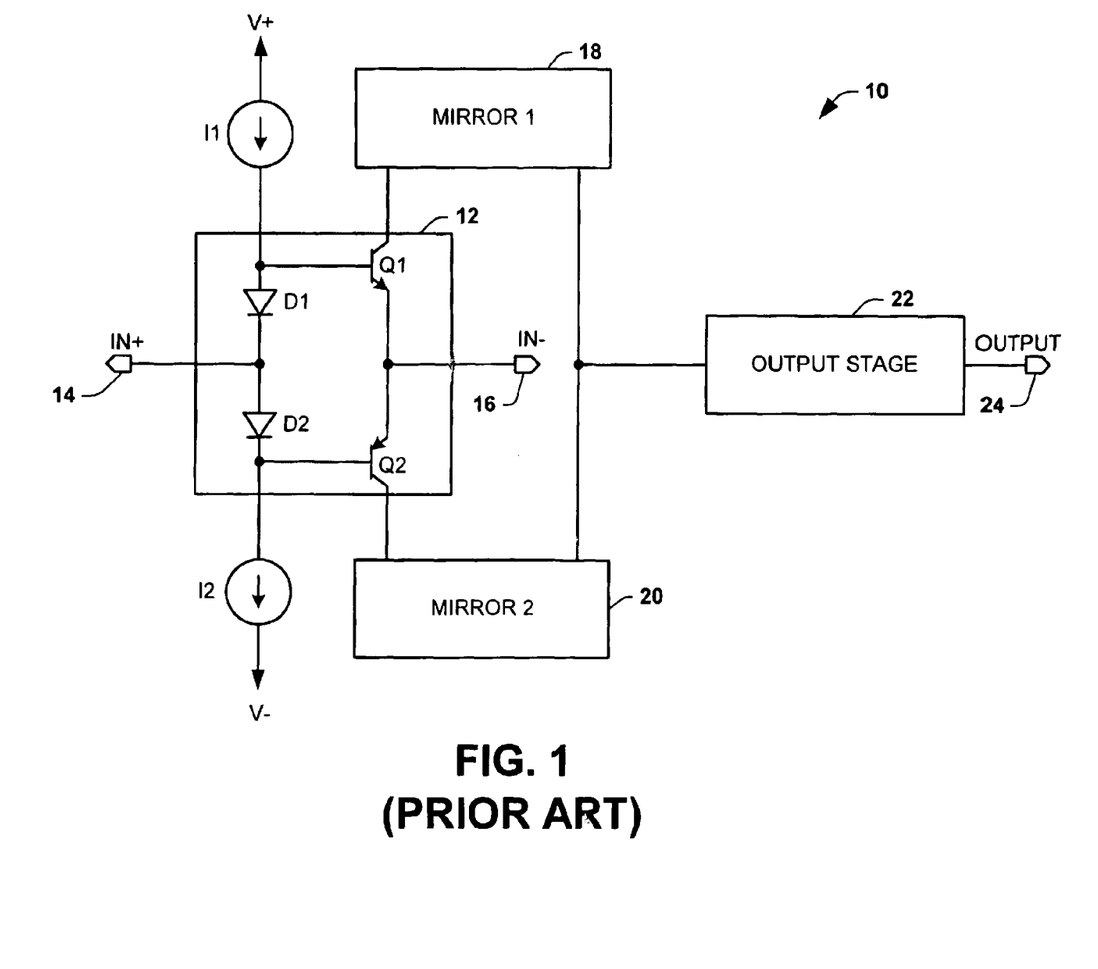
FIG. 1 depicts a prior art example of an amplifier.

Prior art FIG. 1 depicts a basic configuration for a diode input current feedback amplifier 10. In the example of FIG. 1, the amplifier 10 includes an input buffer 12 that includes non-inverting and inverting inputs 14 and 16, respectively. The input buffer 12 is biased by a pair of current sources, indicated at I1 and I2. I1 and I2 are respectively coupled to V+ and V−, where V+ is greater than V−. The basic configuration of the input buffer 12 further includes a pair of diodes D1 and D2 coupled between the respective current sources I1 and I2. The non-inverting input 14 is coupled to a node that interconnects the respective diodes D1 and D2. A pair of transistors Q1 and Q2 are coupled across the diodes D1 and D2 to bias respective current mirrors 18 and 20. The inverting input 16 is coupled between Q1 and Q2. The mirrors 18 and 20 are coupled to bias an output stage 22 of the amplifier that provides a corresponding output at 24.

In a typical amplifier, the bias currents I1 and I2 are designed to be substantially identical currents for biasing the input buffer 12. Any difference or mismatch between I1 and I2 can adversely affect operation and performance of the amplifier 10. For instance, process variations associated with fabricating the amplifier 10, including the current sources, can result in a mismatch between I1 and I2. A mismatch between I1 and I2 appears at the input 14 of the input buffer 12, either sourcing or sinking current relative to circuitry coupled at 14. Accordingly, circuitry coupled to drive the input at 14 and 16 can be adversely affected when such a mismatch exists. As larger bias currents I1 and I2 are utilized, a corresponding mismatch tends to increase in magnitude. Consequently, a large mismatch between I1 and I2 causes an associated voltage offset at the output 24, which may be an amplified version of the offset at 14.

Accordingly, while various approaches exist for implementing input buffers, it is desirable to provide additional systems and methods for improved bias matching.

SUMMARY OF INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention relates generally to systems and methods that provide improved bias matching (e.g., for an amplifier). This can be accomplished by providing one or more compensation signals to mitigate mismatch at two or more bias inputs of associated circuitry.

According to one aspect of the present invention, the compensation signal has a value that is substantially equal to a difference between first and second bias signals, such as based on third and fourth signals provided to emulate the bias signals. The compensation signal is provided to combine with one of the first and second bias signals to mitigate the difference between the first and second bias signals. As a result, the associated amplifier circuitry (e.g., an input buffer) receives substantially identical bias signals.

According to another aspect of the present invention, a signal compensator generates a pair of signals to emulate a pair of bias signals. A difference between the pair of emulation signals is utilized to derive a compensation signal, which can be provided to combine with one of the pair of bias signals to mitigate the difference between the bias signals.

The following description and the annexed drawings set forth certain illustrative aspects of the invention. These aspects are indicative, however, of but a few of the various ways in which the principles of the invention may be employed. Other advantages and novel features of the invention will become apparent from the following detailed description of the invention when considered in conjunction with the drawings.

DETAILED DESCRIPTION OF THE INVENTION

The present invention relates generally to systems and methods to improve bias matching (e.g., for a current feedback amplifier). A compensation signal is combined with one or more bias signals to mitigate mismatch between the bias signals. The compensation signal is generated to correspond to the mismatch between the bias signals, such as based on third and fourth signals provided to emulate the respective bias signals. This approach can be implemented to improve performance of an associated amplifier, such as by reducing offset at an input of a portion of the amplifier (e.g., an input buffer) that is biased by the bias signals.

Figure 2:
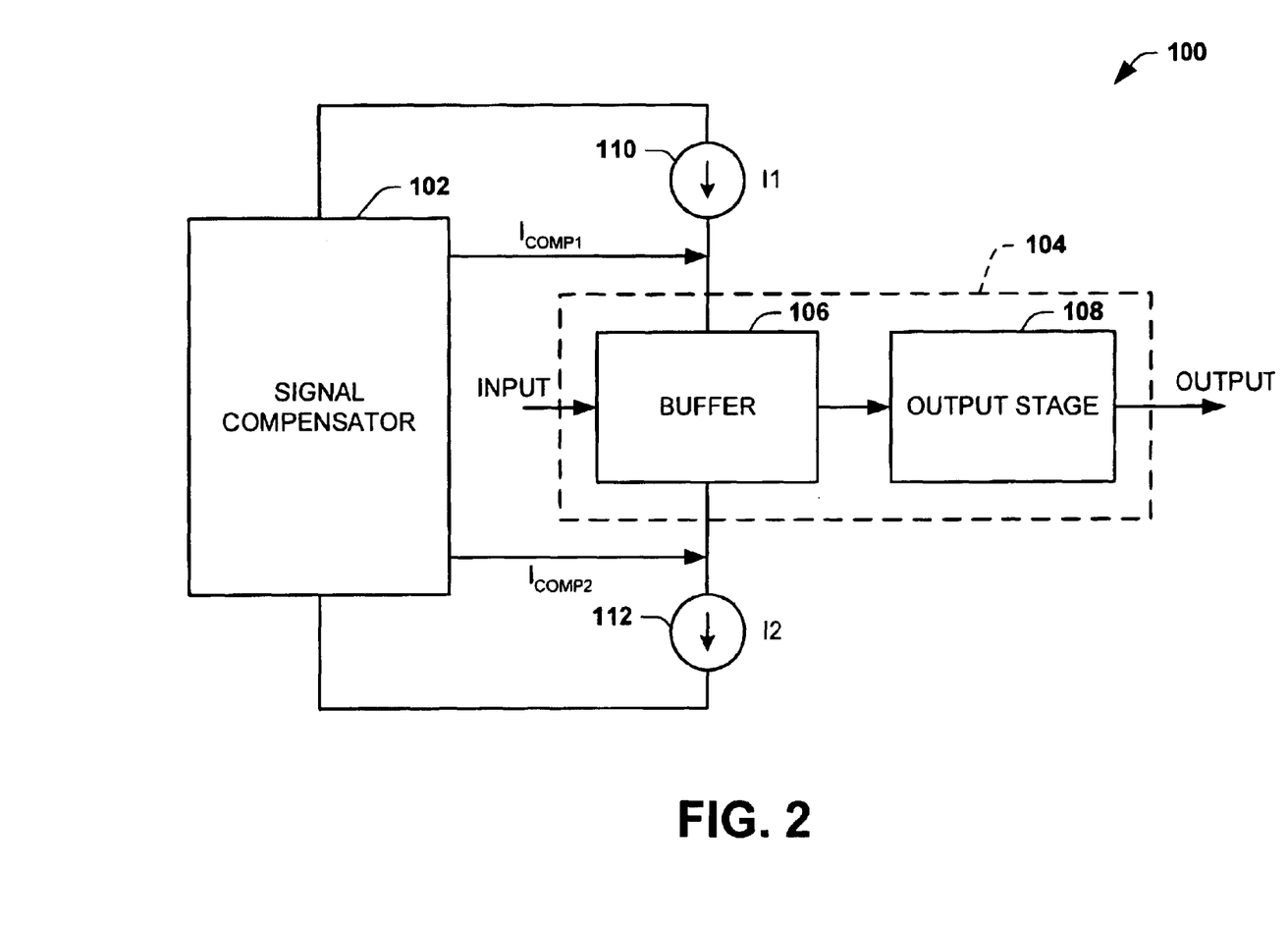
FIG. 2 depicts a block diagram of an amplifier implemented in accordance with an aspect of the present invention.

FIG. 2 is an example of an amplifier system 100 implementing a signal compensator 102 in accordance with an aspect of the present invention. The amplifier system 100 includes an amplifier network 104 that provides an amplified output signal based on an input signal (e.g., a single or differential input). In this example, the amplifier network 104 includes a buffer (e.g., an input buffer) 106 that is coupled to bias an associated output stage 108. The output stage 108 provides the output signal based on the buffered signal provided by the buffer 106. The buffer 106 is biased by a pair of current sources 110 and 112 that provide currents I1 and I2, respectively.

According to an aspect of the present invention, the signal compensator 102 provides currents $I_{COMP1}$ and $I_{COMP2}$ to mitigate mismatch or a difference between the bias currents I1 and I2, respectively. That is, the signal compensator 102 generates the compensation currents $I_{COMP1}$ and $I_{COMP2}$ to source or sink an amount of current relative one or both of the current sources corresponding to a difference between I1 and I2. Thus, the compensation currents $I_{COMP1}$ and $I_{COMP2}$ combine with the respective bias currents I1 and I2 to substantially eliminate mismatch between the bias currents. As a result, the buffer 106 receives substantially matched bias currents.

By way of example, if I1 is greater than I2, the signal compensator 102 can provide $I_{COMP1}$ so as to sink current from I1, such that an aggregate (or net) current provided to the buffer 106 at one bias input is substantially equal to the current I2 at the other bias input (e.g., I1$-I_{COMP1}$=I2). Alternatively, if I2 is greater than I1, the signal compensator 102 can source the current $I_{COMP2}$ that combines with I2 so that the bias current I1 is substantially identical to the aggregate bias of I2 and $I_{COMP2}$ being supplied at the other input of buffer 106 (e.g., I2$-I_{COMP2}$=I1).

It will be appreciated that the signal compensator 102 thus is capable of correcting for any type of mismatch, namely, if I1>I2 or if I2>I1. It is to be further appreciated that the present invention is not limited by the manner in which the compensation signals are provided. For example, one compensation signal $I_{COMP1}$ or $I_{COMP2}$ can be provided at a corresponding bias input to mitigate the mismatch or both compensation signals can be provided to compensate for a portion of the difference between I1 and I2.

As a result, any mismatch between I1 and I2 will not be reflected at the input to the buffer 106, as might otherwise occur in the absence of implementing compensation according to an aspect of the present invention. This approach further helps protect circuitry (not shown) that is coupled to drive the input of the buffer 106 since no additional current will be provided to (or from) such circuitry to accommodate a mismatch. Additionally, because offset is reduced at the input, offset at the output of the amplifier network 104 also is mitigated.

Figure 3:
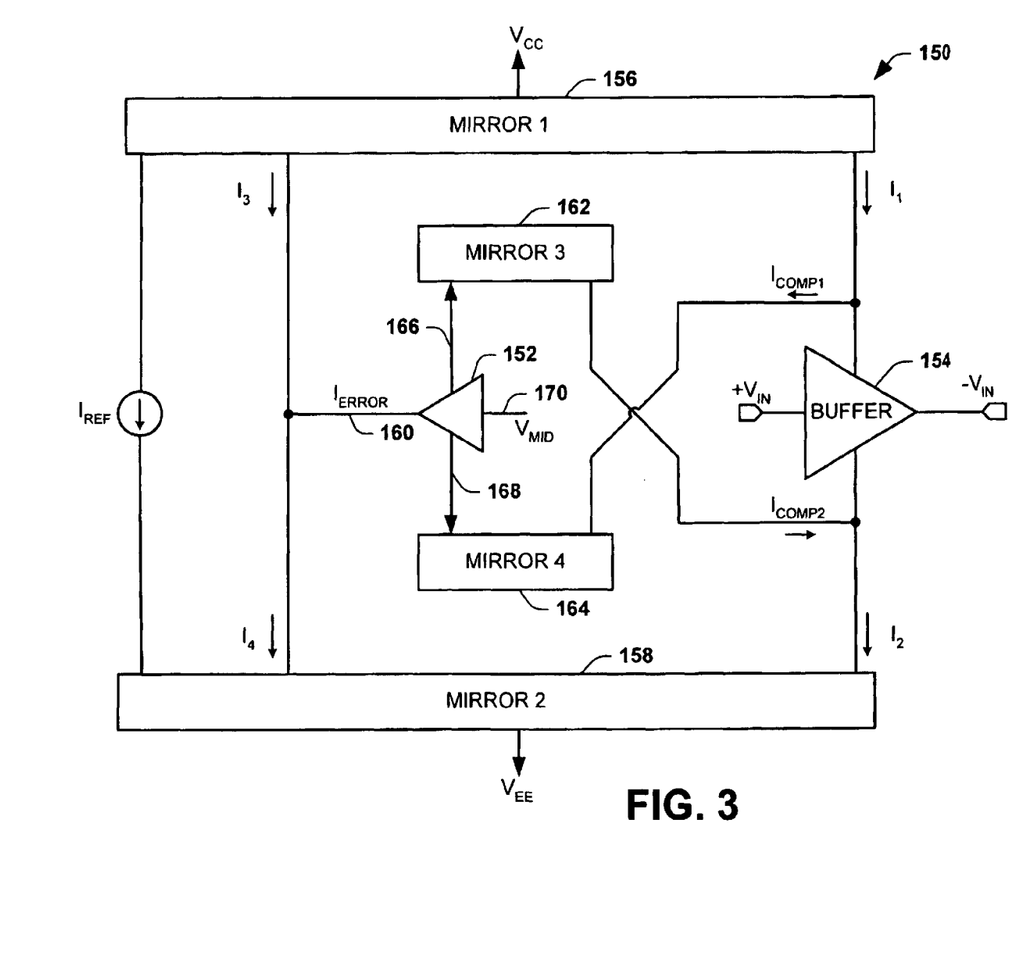
FIG. 3 depicts an example of a compensation system in combination with an input buffer in accordance with an aspect of the present invention.

FIG. 3 is an example of a compensation system 150 implemented in accordance with an aspect of the present invention. The compensation system 150 includes a compensation buffer 152 that is operative to mitigate mismatch between bias currents I1 and I2 that are provided to an input buffer 154 of an associated amplifier. The bias currents I1 and I2 are generated by current mirrors 156 and 158 based on a reference current $I_{REF}$. The compensation buffer 152 receives an input signal $I_{ERROR}$ at an input 160. The input signal $I_{ERROR}$ corresponds to a difference between the bias currents I1 and I2 provided to the input buffer 154. The buffer 152 biases respective current mirrors 162 and 164 based on $I_{ERROR}$.

The current mirrors 156 and 158 also can be employed to provide currents I3 and I4 to the input 160 of the compensation buffer 152. Thus, in the example of FIG. 3, an error current $I_{ERROR}$ is equal to the current I3 minus current I4. In accordance with an aspect of the present invention, the I3 is substantially equal to the current I1, and I4 is substantially equal to I2. It will be appreciated that while I1 and I2 are designed to be identical, in practice, process variations usually cause some amount of mismatch between these currents. By designing the current sources that provide I3 and I4 to be the same as I1 and I2, respectively, the same process variations that cause a mismatch between I1 and I2 also cause a corresponding mismatch between I3 and I4. That is, $I_{ERROR}$, which is equal to a difference between I3 and I4, corresponds to the mismatch between I1 and I2. Those skilled in the art will understand and appreciate various ways in which to implement current sources that provide I3 and I4 to emulate the currents I1 and I2 associated with the input buffer 154.

The compensation buffer 152 provides respective control signals 166 and 168 to the mirrors 162 and 164, respectively. The mirrors 162 and 164, in turn, provide compensation signals $I_{COMP1}$ and $I_{COMP2}$ based on the respective control signals 166 and 168. As a result, compensation signals $I_{COMP1}$ and $I_{COMP2}$ are applied to combine with the bias currents I1 and I2 to mitigate mismatch in the bias currents received by the buffer 154 in accordance with an aspect of the present invention. For example, if I1 is greater than I2, the mirror 164 can sink current $I_{COMP1}$ away from the buffer 154 based on the control signal 168. That is, the mirror 164 generates $I_{COMP1}$ to be substantially equal to the amount of current by which I1 exceeds I2. Similarly, if I2 is greater than I1, the mirror 162 can source current $I_{COMP2}$ based on the control signal 166, which current combines with I2, such that $I_{COMP2}$ plus I2 is equal to the bias associated with I1 (e.g., $I_{COMP2}$=I2−I1). Thus, the compensation buffer 152 can control which mirror 162 or 164 will provide its compensation signal based on a characteristic of $I_{ERROR}$ (e.g., whether the $I_{ERROR}$ is positive or negative).

In order to facilitate operation of the compensation system 150, another input 170 of the compensation buffer 152 receives a voltage level, indicated at $V_{MID}$, which is substantially equal to a midpoint voltage of the circuit arrangement. For example, if the system 150 is implemented between $V_{CC}$ and $V_{EE}$ voltage rails, a corresponding midpoint voltage $V_{MID}$ (e.g., 0 V for a bipolar supply) is provided at the input 170 of the compensation buffer 152. The midpoint voltage $V_{MID}$ alternatively could be set to a common mode voltage of the associated amplifier. By maintaining the midpoint voltage at the other input 170 of the compensation buffer 152, the voltage between the current sources I3 and I4 is held near $V_{MID}$. This helps alleviate the early voltage effects associated with the current sources I3 and I4.

Figure 4:
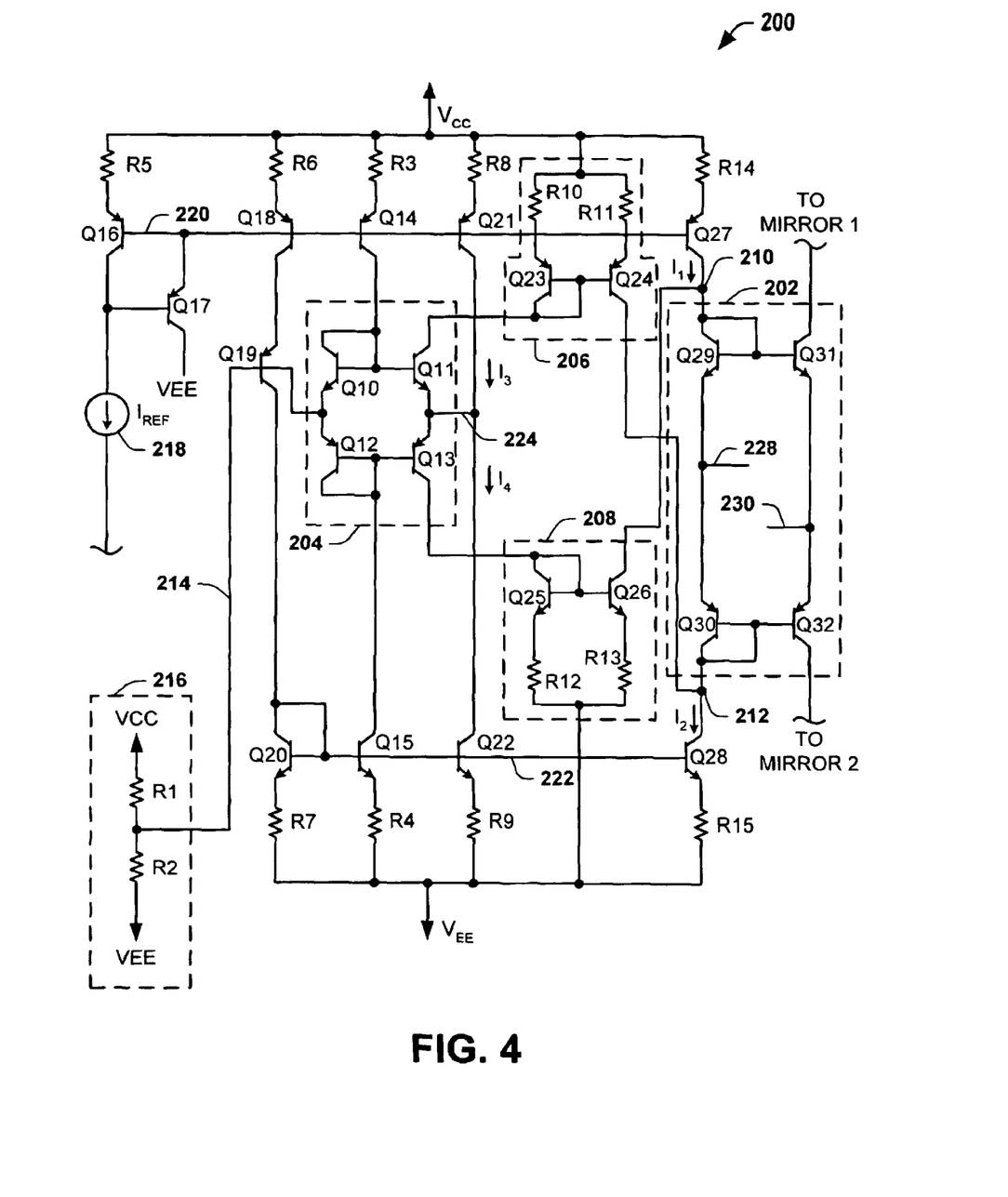
FIG. 4 depicts a circuit diagram for a compensation system and input buffer that can be implemented in accordance with an aspect of the present invention.

FIG. 4 is a circuit diagram that illustrates an example compensation system 200 that can be implemented in combination with a buffer 202 in accordance with an aspect of the present invention. The compensation system 200 includes a compensation buffer 204 that is coupled to control associated current mirrors 206 and 208 to supply corresponding compensation signals at bias inputs 210 and 212 of the associated buffer 202. The buffer 202, for example, corresponds to an input buffer that forms part of an amplifier (not shown). The compensation signals are controlled to mitigate mismatch in the bias signals supplied at the bias inputs 210 and 212 of the input buffer 202.

In this example, the compensation buffer 204 includes an arrangement of transistors Q10, Q11, Q12 and Q13 that are operative to bias the current mirrors 206 and 208. In particular, a common emitter of Q10 and Q12 is coupled to an input 214 that receives a midpoint voltage. The midpoint voltage, for example, can be supplied by a voltage divider 216 that includes resistors R1 and R2 coupled between voltage rails $V_{CC}$ and $V_{EE}$. Those skilled in the art will understand and appreciate various other approaches that can be utilized to supply a suitable midpoint voltage at the input 214. For example, a common mode voltage of the associated amplifier system could be coupled to the input 214 through appropriate circuitry.

The compensation buffer 204 is biased by a first current source that includes a transistor Q14 and a resistor R3 coupled to a common base of Q10 and Q11. Another current source, which includes a transistor Q15 and a resistor R4, is coupled to a common base of Q12 and Q13. Q10 and Q12 are each diode connected transistors between the respective current sources.

To help reduce power consumption associated with the compensation system 200, it is desirable to keep the bias currents associated with transistors Q14 and Q15 small. For example, the reference current $I_{REF}$ provided by the current source 218 can be maintained around 100 µA or lower. Those skilled in the art will understand and appreciate various other implementations that could be utilized to help reduce power consumption associated with operation of the compensation system 200.

The collector of Q11 is coupled to bias current mirror 206 and the collector of Q13 is coupled to bias current mirror 208. A current source 218 supplies a reference current $I_{REF}$ to the compensation system 200 through a transistor Q16. Another transistor Q17 is coupled as a follower across the base and collector of Q16 (e.g., forming a diode connection) to help drive a baseline node 220 at a desired level for biasing other current sources. Q16 is coupled between $I_{REF}$ and $V_{CC}$ through a resistor R5.

A transistor Q18 has its emitter coupled to $V_{CC}$ through a resistor R6. Q18 is coupled through a transistor Q19 to establish a current that is utilized to bias another baseline 222 that is associated with $V_{EE}$. In particular, Q18 provides current to diode connected transistor Q20 associated with the baseline 222. Q20 is coupled in series with a resistor R7 between Q19 and $V_{EE}$.

The bias at the baseline 220 also drives a current source that includes a transistor Q21, which is coupled in series with a resistor R8 between $V_{CC}$ and an input 224 of the compensation buffer 204. This current source supplies a current I3 to the input 224 according to the bias provided at the baseline 220. Another current source includes a transistor Q22 coupled in series with a resistor R9 between Q21 and $V_{EE}$. This current source is biased by the baseline 222 to sink current I4 from the input 224.

According to an aspect of the present invention, the current I3 is designed to be substantially identical to the current I1, and the current I4 is designed to be substantially identical to the current I2. In this way, any mismatch between I1 and I2 should also exist as a corresponding mismatch between I3 and I4. This mismatch causes a respective current (e.g., equal to the difference between I3 and I4) to be provided at the input 224 of the compensation buffer 204. The compensation buffer 204 controls the current mirrors 206 and 208 based on a difference in current between I3 and I4 at the input 224 according to an aspect of the present invention.

The current mirror 206 includes transistors Q23 and Q24, each having their emitter coupled to $V_{CC}$ through a respective resistor R10 and R11. Q23 is diode connected with its base and collector coupled to the collector Q11 for receiving a control signal for biasing the mirror 206. The collector of Q24 is coupled to the input 212 of the input buffer 202 for providing a compensation current signal based on the control signal from the compensation buffer. As mentioned above, the compensation buffer 204 provides the control signal to the current mirror 206 based on the difference current (e.g., $I_{ERROR}$=I3-I4) supplied at the input 224 of the compensation buffer.

Similarly, the current mirror 208 is formed of transistors Q25 and Q26, Q25 being diode connected. Q25 and Q26 have their common base coupled to the collector of Q13. Additionally, Q25 and Q26 each has its emitter coupled to $V_{EE}$ through respective resistors R12 and R13. The collector of Q26 further is coupled to the input 210 associated with the input buffer 202. Thus, the current mirror 208 is operative to sink current away from the node 210 based on the control signal provided by the compensation buffer 204. The control signal corresponds to difference current (e.g., $I_{ERROR}$=I3-I4) provided at 224.

The current I1 is supplied by a current source that includes a transistor Q27 coupled in series with a resistor R14 between the input 210 and $V_{CC}$. Similarly, another current source includes a transistor Q28 coupled in series with a resistor R15 between the input 212 and $V_{EE}$. Q27 is biased according to the signal at the baseline 220, and Q28 is biased based on the signal provided at the other baseline 222.

By way of further example, if I4 is greater than I3 (corresponding to a situation when I2 is greater than I1), the current source associated with Q22 draws more current from the input 224 of the compensation buffer 204 than the current source associated with Q21 is providing. Thus, the compensation buffer 204 provides additional current at 224 to accommodate the difference between I3 and I4. The current mirror 206 provides such additional current to the compensation buffer 204 (e.g., to the collector of Q11). As a result, the current mirror 206, in turn, provides additional current at the input 212 (e.g., via Q24). The amount of additional current will be equal (or proportional) to the difference between currents I4 and I3. As mentioned above, because the difference between currents I3 and I4 corresponds to the difference between currents I1 and I2, the bias currents provided to the input buffer 202 at 210 and 212 will be substantially matched.

When the current source associated with Q21 sources more current than provided by the current source associated with Q22, I3 is greater than I4. This corresponds to a situation in which I1 is greater than I2. Consequently, a difference current (e.g., $I_{ERROR}$=I3-I4) is provided to the input 224 of the compensation buffer 204. This causes the current mirror 208 to sink this additional current from the buffer 204. The current mirror 208, in turn, sinks the additional current from the input 210 via the collector of Q26. As a result, the bias current at 210 is decreased by an amount equal to the amount that I1 exceeds I2, thereby providing substantially identical bias currents to the buffer 202.

The compensation buffer 204 can control which mirror (or mirrors) 206 or 208 will provide a compensation signal based on a characteristic of the difference between I3 and I4 provided at 224 (e.g., based on the direction of current flow at 224). It will be appreciated that, regardless of whether it is actively implementing compensation, each of the current mirrors 206 and 208 may also provide some amount of static dc current to the bias inputs 210 and 212, respectively, In the example of FIG. 4, the input buffer 202 includes diode connected transistors Q29 and Q30 coupled in series between the inputs 210 and 212. A common emitter of Q29 and Q30 defines an input (e.g., a non-inverting input) 228 of the buffer 202. The buffer 202 also includes a transistor Q31 having a common base with Q29 and is connected in series with a transistor Q32. A common emitter of Q31 and Q32 defines another input (e.g., an inverting input 230) of the buffer 202. The collector of Q31 is coupled to bias an associated current mirror (not shown). Q32 also has a common base with Q30 and a collector of which is coupled to bias another associated current mirror (not shown).

Because the compensation system 200 mitigates potential biasing mismatches at the inputs 210 and 212 of the input buffer 202, a desired low offset is achieved at the non-inverting input 212. For example, in the absence of such compensation, a mismatch between I1 and I2 will require current corresponding to the mismatch being provided at the non-inverting input 228 as well as result in a corresponding offset at such input. Such an offset can adversely affect associated circuitry that is coupled to drive the input 228. Additionally, it will be understood and appreciated that the architecture depicted in the example of FIG. 4 can correct for mismatches in either direction. That is, a corresponding compensation signal can be provided relative to 210 or 212 depending on the direction in which the error signal is provided at 224 to the compensation buffer 204.

The bi-polar transistor arrangement depicted in FIG. 4 also is advantageous for an amplifier integrated circuit fabricated using a BICMOS or CMOS process. For example, Q27 may correspond to a PMOS transistor and Q28 may correspond to an NMOS transistor. Accordingly, during BICMOS or CMOS process fabrication, variations may affect one or the other type of transistors differently. Thus, by utilizing the same type of transistors to generate emulated currents I3 and I4, the same process variations that result in a current mismatches between currents I1 and I2 will also result in a corresponding mismatch between currents I3 and I4.

Figure 5:
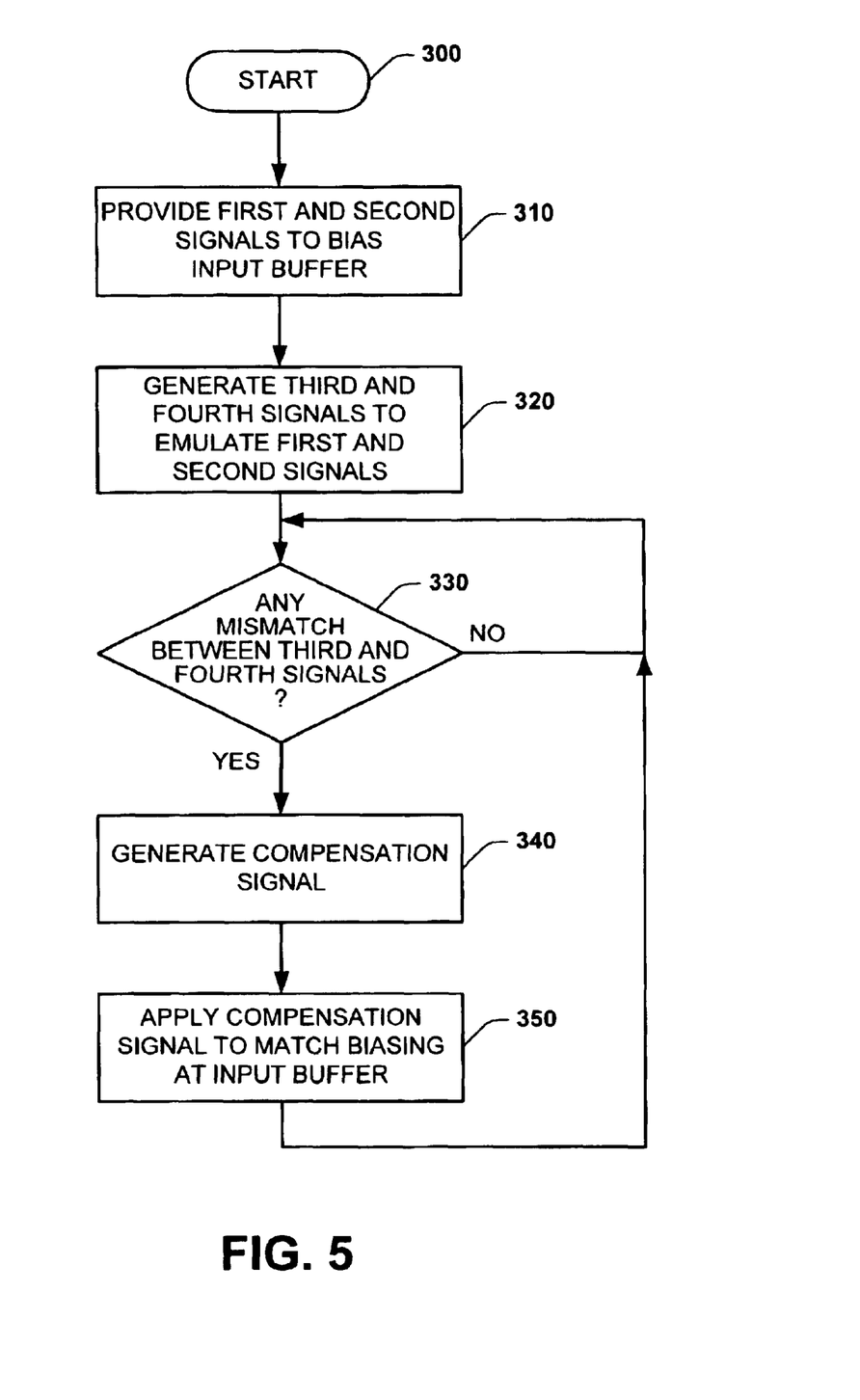
FIG. 5 is a flow diagram illustrating methodology for improving bias matching in accordance with an aspect of the present invention.

In view of the foregoing structural and functional features described above, an amplification methodology, in accordance with an aspect of the present invention, will be better appreciated with reference to FIG. 5. While, for purposes of simplicity of explanation, the methodology of FIG. 5 is shown and described as being implemented serially, it is to be understood and appreciated that the present invention is not limited to the illustrated order, as some aspects could, in accordance with the present invention, occur in different orders and/or concurrently with other aspects from that shown and described. Moreover, not all illustrated features may be required to implement a methodology in accordance with an aspect of the present invention. It is to be further understood that the following methodologies can be implemented in hardware, such as one or more integrated circuits, software, or any combination thereof.

The methodology of FIG. 5 begins at 300, such as in connection with powering up an associated integrated circuit that includes an amplifier system configured to implement the methodology. This can include setting voltage rails to desired levels and biasing reference currents to provide desired current levels. At 310, first and second signals are provided to bias an associated input buffer of the amplifier system. The first and second signals, for example, are current signals generated by respective current mirrors.

In an ideal situation, the first and second signals are provided as currents of equal magnitude to bias the input buffer. In practice, however, the first and second signals contain some amount of mismatch. Such mismatch can arise from process variations in which the first signal is generated by a current source that includes a first type of transistor (e.g., an NPN or NMOS) and the second signal is generated by a current source formed of another type of transistor (e.g., a PNP or PMOS). It is well known in the art that when the first and second signals are applied to bias the input buffer, but are not identical, a corresponding mismatch will exist. This mismatch can manifest itself as an offset at a corresponding input of the input buffer. The offset can induce problems with circuitry coupled to drive such input as well as result in a corresponding offset at the output of the amplifier.

At 320, third and fourth signals are generated to emulate the first and second signals (at 310). The third and fourth signals, for example, are generated to be substantially identical to the first and second signals, respectively. In this way, any mismatch associated with the first and second signals will also exist as a corresponding mismatch between the third and fourth signals.

By way of example, a current source utilized to generate the third signal can be substantially identical to the current source utilized to generate the first signal. Similarly, the current source utilized to generate the fourth signal can be substantially identical to the current source utilized to generate the second signal. Because similar types of devices are utilized to generate corresponding signals, process variations that may result in a mismatch between the first and second will also result in a corresponding mismatch between the third and fourth signals.

At 330, a determination is made as to whether any mismatch exists between the third and fourth signals. This determination, for example, can be implemented by applying the third and fourth signals at a corresponding input of a compensation buffer, such that any difference between the third and fourth signal (e.g., a mismatch) will result in a corresponding error signal being provided at the input of the compensation buffer. If the determination at 330 is negative, the methodology can loop at 330 until such a mismatch exists. When a mismatch exists (e.g., an error signal is provided to the compensation buffer), the methodology proceeds to 340.

At 340, one or more compensation signals is generated. The compensation signal will be provided based on the difference between the third and fourth signals. At 350, the compensation signal is applied to match the biasing at the input buffer. For example, the compensation signal is combined (e.g., added or subtracted) with one of the first and second signals to provide matched biasing to the input buffer. In this way, performance of the associated amplifier is improved and little or no offset is applied at the input of the input buffer. As a result, offset at the corresponding output of the associated amplifier implementing the methodology can be reduced.

What has been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A system for providing substantially matched bias signals, comprising:
    a signal compensator that provides a compensation signal that combines with one of first and second bias signals to mitigate a difference between the first and second bias signals, the signal compensator provides the compensation signal based on third and fourth signal generated to emulate the first and second bias signals, respectively.

2. The system of claim 1, further comprising a compensation buffer that provides a control signal based on a difference between the third and fourth signals, the signal compensator provides the compensation signal based on the control signal.

3. The system of claim 2, further comprising:
    a first current source coupled to provide the third signal to emulate the first bias signal; and
    a second current source coupled to provide the fourth signal to emulate the second bias signal,
    the third and fourth signals being provided to an input of the compensation buffer, the compensation buffer provides the control signal based on a difference between the third and fourth signals.

4. The system of claim 2, further comprising a voltage supply that provides a reference voltage to the compensation buffer, the reference voltage being near a midpoint of high and low voltage rails implemented by the system.

5. The system of claim 4, the voltage supply further comprising a voltage divider coupled between the voltage rails.

6. The system of claim 1, further comprising at least one current mirror coupled to supply the compensation signal to the one of the first and second bias signals based on the control signal.

7. The system of claim 6, further comprising:
    a first current mirror coupled to supply a first compensation signal to the first bias signal based on the third and fourth signals; and
    a second current mirror coupled to supply a second compensation signal to the second bias signal based on the third and fourth signals.

8. An amplifier comprising the system of claim 1.

9. The amplifier of claim 8 further comprising an input buffer that is biased by the first and second bias signals, the amplifier provides an output based on an input signal provided to an input of the input buffer.

10. The amplifier of claim 9, the input buffer further comprising a pair of diodes coupled in series between respective inputs to which the first and second bias signals are provided, the input of the input buffer defines a node between the pair of diodes, the input corresponds to one of an inverting and a non-inverting input of the input buffer.

11. An amplifier system comprising:
    an input buffer having at least one input that receives an input signal, the input buffer is biased by respective signals received at first and second bias inputs thereof; and
    a signal compensator that provides a compensation signal to at least one of the first and second bias inputs so that the respective signals received by the input buffer at the first and second bias inputs substantially match each other, the compensation corresponds to a difference between first and second bias signals.

12. The amplifier of claim 11, further comprising:
    a first current source that provides a first bias signal to the first bias input;
    a second current source that provides a second bias signal to the second bias input;
    a third current source that provides a third current to emulate the first bias signal; and
    a fourth current source that provides a fourth current to emulate the second bias signal,
    the signal compensator provides the compensation signal based on the third and fourth signals.

13. The amplifier of claim 12, further comprising a compensation buffer that provides a control signal based on a difference between the third and fourth signals, the signal compensator provides the compensation signal based on the control signal.

14. The amplifier of claim 13, further comprising a voltage supply that supplies a reference voltage to the compensation buffer, the reference voltage being near a midpoint of high and low voltage rails implemented by the system.

15. The amplifier of claim 14, the voltage supply further comprising a voltage divider coupled between the voltage rails.

16. The amplifier of claim 13, the signal compensator further comprising at least one current mirror coupled to supply the compensation signal to the one of the first and second bias inputs based on the control signal.

17. The amplifier of claim 16, further comprising:
    a first current mirror coupled to supply a first compensation signal to the first bias input based on the third and fourth signals; and
    a second current mirror coupled to supply a second compensation signal to the second bias input based on the third and fourth signals.

18. The amplifier of claim 11, further comprising an output stage coupled to the input buffer, the output stage providing an output signal based on the input signal provided at the at least one input of the input buffer.

19. An integrated circuit comprising the amplifier of claim 11.

20. A system for providing substantially matched bias signals, comprising:
    means for emulating first and second bias signals that are provided to bias an associated circuit; and
    means for providing a compensation signal that combines with at least one of first and second bias signals to mitigate a difference between the first and second bias signals, the compensation signal being provided based on third and fourth signals provided by the means for emulating.

21. The system of claim 20, further comprising means for providing a difference signal based on a difference between the third and fourth signals provided by the means for emulating, the means for providing further providing the compensation signal based on the difference signal.

22. The system of claim 21, further comprising:
    means for supplying a first compensation signal to the first bias signal based on the difference signal; and
    means for supplying a second compensation signal to the second bias signal based on the difference signal.

23. An amplifier comprising the system of claim 20, the amplifier further comprising means for buffering an amplifier input signal, the means for buffering being biased based on the first and second bias signals and the compensation signal, whereby mismatch in biasing the means for buffering is mitigated.

24. A method for improving bias matching of an amplifier, comprising:

provi­ding first and second bias signals at first and second bias inputs of an amplifier;

generating third and fourth signals to emulate the first and second bias signals; and providing a compensation signal to at least one of the first and second bias inputs based on the third and fourth signals, such that aggregate signals at each of the first and second bias inputs substantially match.

25. The method of claim 24, the providing the compensation signal further comprising:

supplying a first compensation signal to the first bias signal based on a difference between the third and fourth signals; and supplying a second compensation signal to the second bias signal based on the difference between the third and fourth signals.

26. The method of claim 25, further comprising controlling which of the first and second compensation signals is provided based on a characteristic associated with the difference between the third and fourth signals.

* * * * *